United States Patent
Ohyama

(10) Patent No.: US 6,284,984 B1
(45) Date of Patent: Sep. 4, 2001

(54) PRINTED CIRCUIT BOARD, FOR MOUNTING BGA ELEMENTS AND A MANUFACTURING METHOD OF A PRINTED CIRCUIT BOARD FOR MOUNTING BGA ELEMENTS

(75) Inventor: Kazuyuki Ohyama, Tokyo (JP)

(73) Assignee: NEC Infrontia Corporation, Kawasaki (JP)

( * ) Notice: Subject to any disclaimer, the term of this patent is extended or adjusted under 35 U.S.C. 154(b) by 0 days.

(21) Appl. No.: 09/280,846

(22) Filed: Mar. 30, 1999

(30) Foreign Application Priority Data

Mar. 31, 1998 (JP) .................................................. 10-101914

(51) Int. Cl.⁷ ...................................................... H05K 1/16
(52) U.S. Cl. .............................. 174/260; 361/767; 29/840
(58) Field of Search ..................................... 174/266, 262; 361/767, 768, 769, 770, 771, 783, 792, 795; 29/840

(56) References Cited

U.S. PATENT DOCUMENTS

| | | | |
|---|---|---|---|
| 4,729,061 | * | 3/1988 | Brown .................................. 361/386 |
| 5,218,761 | * | 6/1993 | Maniwa et al. ........................ 29/852 |
| 5,263,243 | * | 11/1993 | Taneda et al. ......................... 29/830 |
| 5,329,423 | * | 7/1994 | Scholz .................................. 361/760 |
| 5,543,586 | * | 8/1996 | Crane, Jr. et al. .................... 174/262 |
| 5,744,758 | * | 4/1998 | Takenouchi et al. ................. 174/255 |

FOREIGN PATENT DOCUMENTS

| | | |
|---|---|---|
| 4-150095 | 5/1992 | (JP) . |
| 7-79080 | 3/1995 | (JP) . |
| 7-335992 | 12/1995 | (JP) . |
| 9-246684 | 9/1997 | (JP) . |

OTHER PUBLICATIONS

Japanese Office Action, dated Nov. 16, 1999, with English language translation of Japanese Eaminer's comments.

* cited by examiner

Primary Examiner—Jeffrey Gaffin
Assistant Examiner—Jeremy Norris
(74) Attorney, Agent, or Firm—McGuireWoods LLP

(57) ABSTRACT

A printed circuit board and a manufacturing method of a printed circuit board which ensure high mechanical bonding strength and reliable electrical connection and permit ready mounting are provided. The printed circuit board has: n (n: an integer) conducting pattern layers on each of which a wiring pattern is formed; (n+1) insulating patterns formed alternately with the conducting pattern layers; conducting pads formed on the wiring patterns of the conducting pattern layers; and openings continuous from the conducting pads to a surface of the topmost of the insulating layers, penetrating the insulating layers.

14 Claims, 17 Drawing Sheets

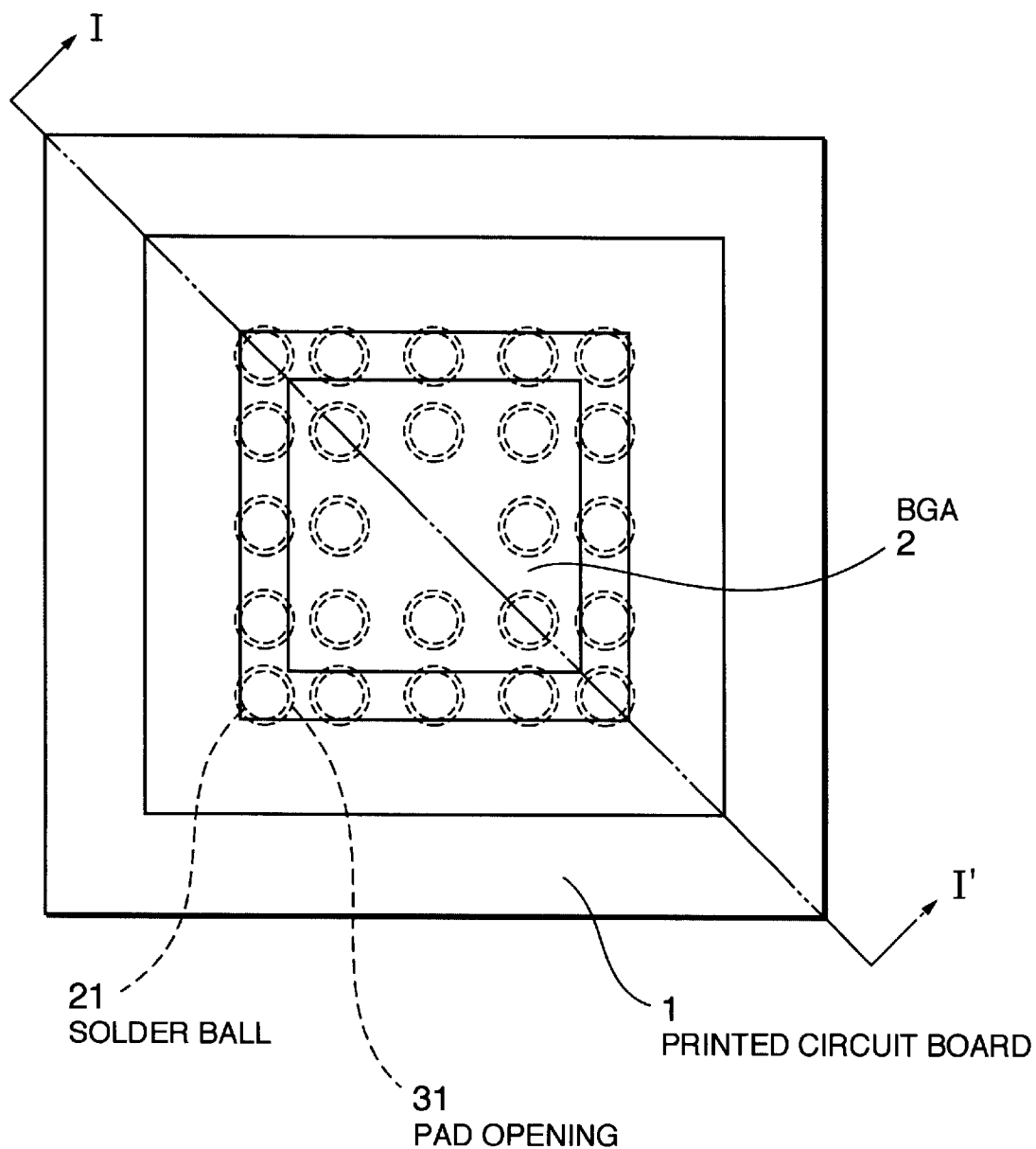

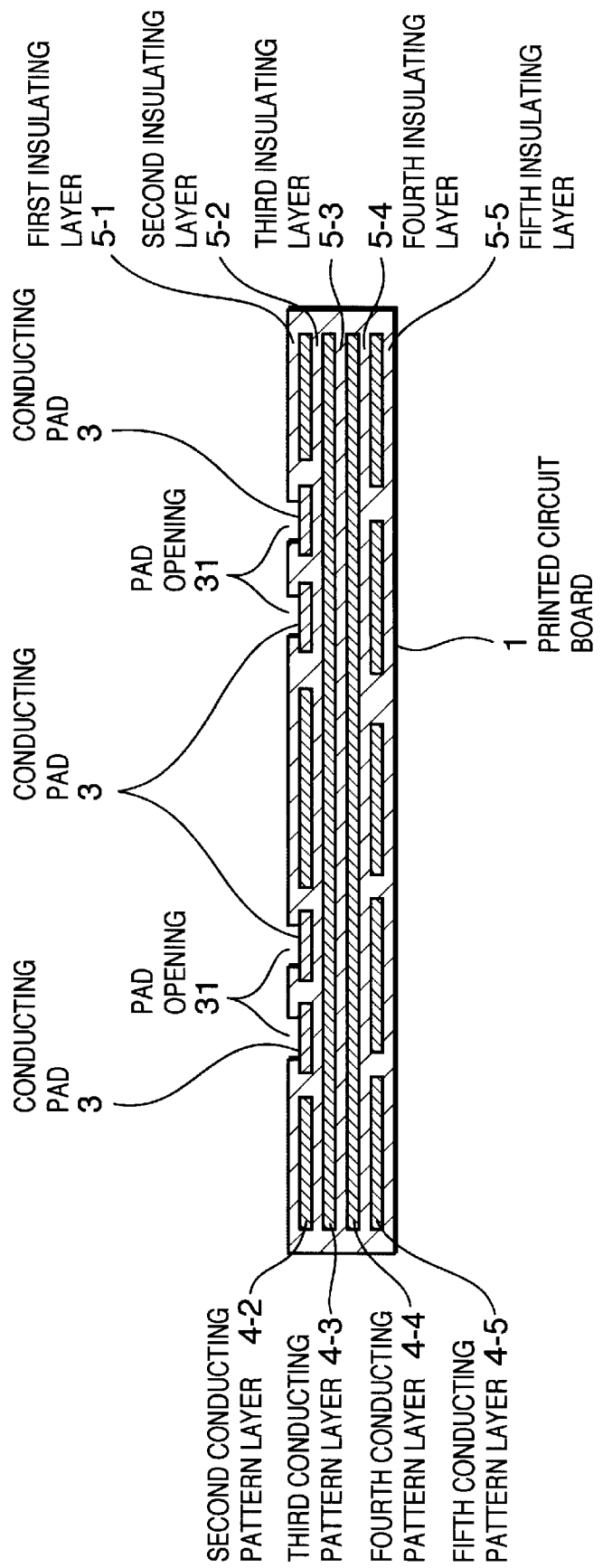

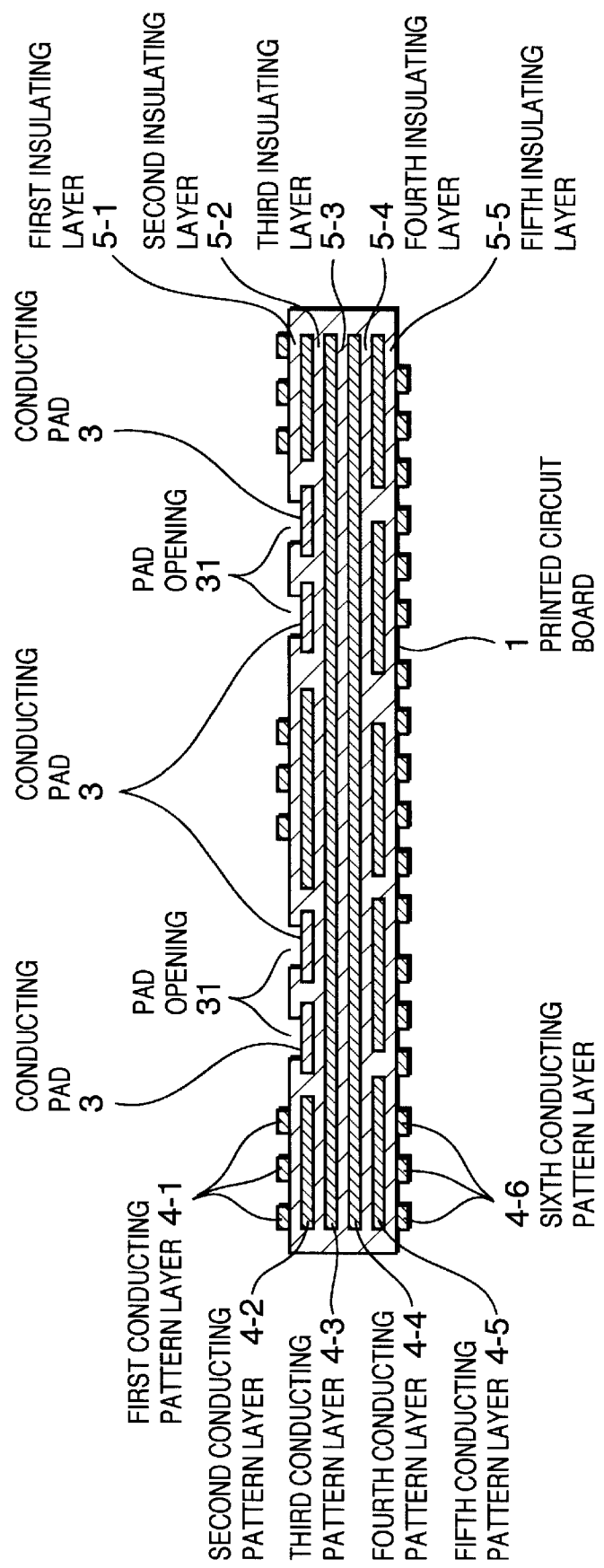

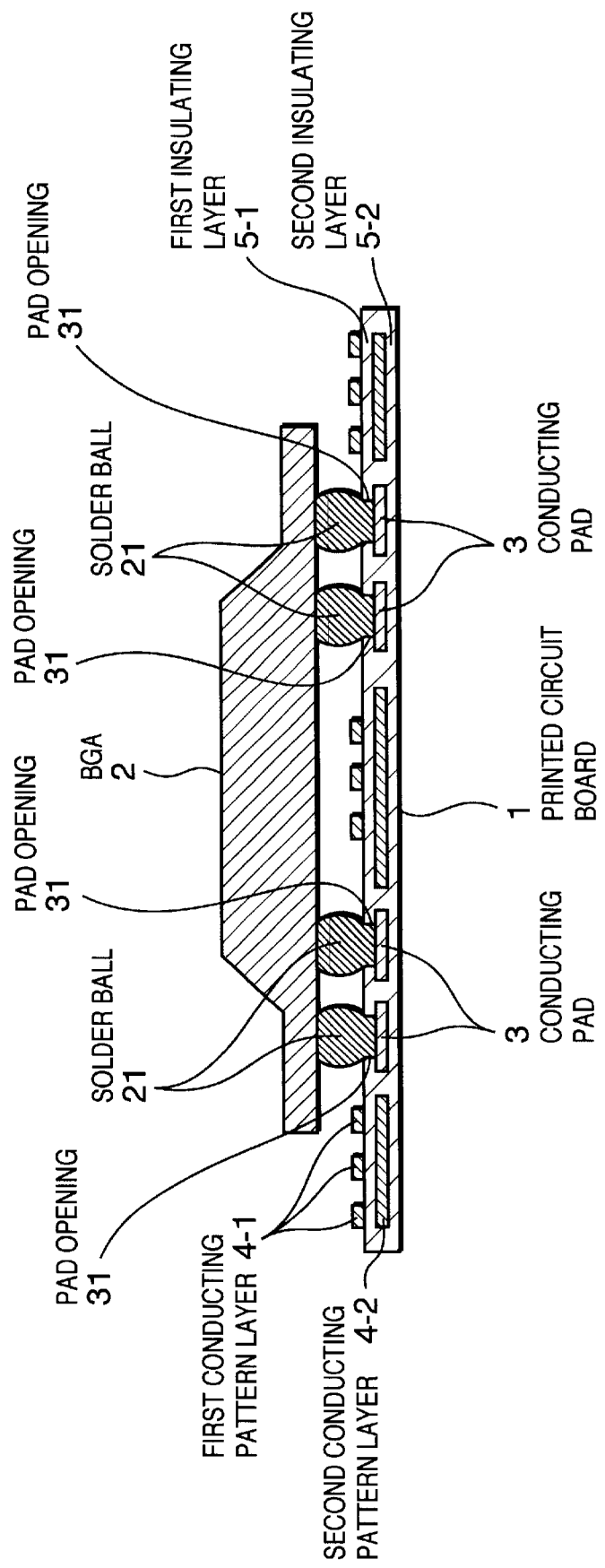

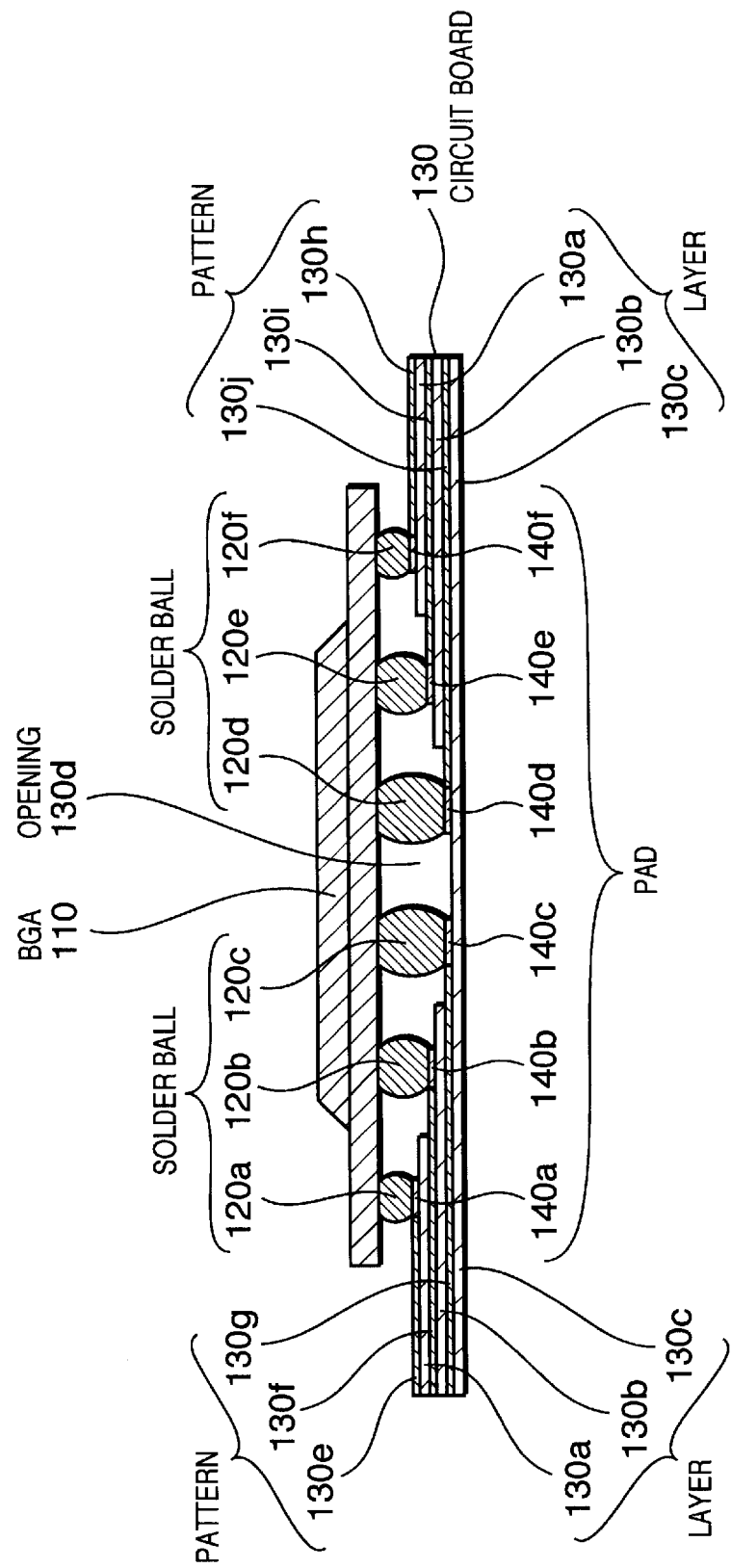

PRINTED CIRCUIT BOARD, FOR MOUNTING BGA ELEMENTS AND A MANUFACTURING METHOD OF A PRINTED CIRCUIT BOARD FOR MOUNTING BGA ELEMENTS

FIELD OF THE INVENTION

The present invention relates to a printed circuit board, on whose surface a ball grid array element is mounted.

DESCRIPTION OF THE PRIOR ART

A ball grid array (hereinafter abbreviated as BGA), a sort of semiconductor element, is a multi-terminal semiconductor element, on which many solder balls are formed on its bottom surface.

Mounting of this BGA on a printed circuit board is basically accomplished by melting solder balls by heating, and solidifying the solder balls onto conductor pads formed opposite to the solder balls on the printed circuit board, respectively.

However, the BGA and the printed circuit board are only connected by many solder balls and conductor pads having small size. Therefore mechanical stresses resulting from bending, vibration, impact and the like working on the printed circuit board after its mounting tend to invite poor contact between solder balls and conductor pads or peeling of conductor pads. Many mounting methods have already been devised to solve this technical problem.

One of these mounting methods is an under-fill method. In this method, liquid resin is injected between a BGA and the printed circuit board after the BGA is mounted as described above. Then the liquid resin is hardened to adhere the BGA to the printed circuit board in an integrated manner and thereby to increase the bonding strength.

For mounting a BGA on a printed circuit board configured by stacking a plurality of conductor layers, there has been a method disclosed in the Japanese Patent Laid-open No. Hei 9-246684 (disclosed on Sep. 19, 1997). This method will be described below as an example of the prior art.

FIG. 7 is a longitudinal sectional view of the BGA mounting structure of the prior art.

A circuit board 130 has of an opening 130d and pads 140a to 140f. The opening 130d has a stepwise structure increasing in depth toward the center, provided in the part where a BGA 110 is to be mounted. The pads 140a to 140f connected to patterns 130e to 130j in different exposed parts of a multi-layered circuit board 130 and to be mounted with solder balls 120a to 120f. The BGA 110 has the solder balls 120a to 120f, growing in size toward the center so as to be mounted on the pads 140a to 140f provided on the circuit board 130. The solder balls 120a to 120f are melted on the pads 140a to 140f to connect the circuit board 130 and the BGA 110.

However, the conventional under-fill method referred to above involves the extra steps of resin injection and hardening, resulting in the problems of slower production and higher manufacturing costs.

Furthermore, the injection resin, once hardened, is extremely difficult to remove, making it impossible to replace any BGA by itself whose contact has become poor and rendering the printed circuit substantially irreparable. Therefore many BGA-mounted printed circuit boards have to be discarded in whole, entailing extremely high repair costs.

The BGA mounting structure disclosed in the Japanese laid-open patent also involves the problem of inadequate mechanical connective strength between the BGA 100 and the circuit board 130 and poor electrical reliability of their connection. Because the solder balls 120a to 120f are only bonded to the pads 140a to 140f, each of a very small size, resulting in insufficient bonding strength and easy peeling of the pads 140a to 140f.

Moreover, since the opening 130d can only be formed in a stepwise structure, there is the problem that the solder balls 120a to 120f cannot be electrically connected to the patterns 130e to 130j as desired, therefore strictly limiting the freedom of wiring and inhibiting sufficient enhancement of the wiring density.

SUMMARY OF THE INVENTION

An object of the present invention is to provide a printed circuit board and a manufacturing method of a printed circuit board which ensure high mechanical bonding strength and reliable electrical connection and permit ready mounting.

A printed circuit board according to the present invention has: n (n: an integer) conducting pattern layers on each of which a wiring pattern is formed; (n+1) insulating patterns formed alternately with the conducting pattern layers; conducting pads formed on the wiring patterns of the conducting pattern layers; and openings continuous from the conducting pads to a surface of the topmost of the insulating layers, penetrating the insulating layers.

A manufacturing method of a printed circuit board according to the present invention has the steps of: forming alternately (n+1) (n: an integer) insulating patterns with n conducting pattern layers on each of which a wiring pattern is formed, and forming openings continuous from the surface of the topmost of the insulating layers to conducting pads formed on the wiring patterns of the conducting pattern layers.

According to the present invention, an internal conducting pattern layer not exposed on the surface and soldered parts of electronic parts are both mechanically bonded and electrically connected in a printed circuit board in which conducting pattern layers and insulating layers are alternately stacked. As the insulating layer that is located closer to the top surface than this conducting layer supports sideways of the soldered members of the electronic parts, the bonding strength of the electronic parts and the printed circuit board is enhanced.

BRIEF DESCRIPTION OF THE DRAWINGS

FIG. 1A is a plan view of a printed circuit board according to the first embodiment of the present invention.

FIG. 1E is a cross sectional view of the third step of the manufacturing method showing along the line I–I' in the FIG. 1A embodiment.

FIG. 1F is a cross sectional view of the fourth step of the manufacturing method showing along the line I–I' in the FIG. 1A embodiment.

FIG. 5B is a cross sectional view showing along the line V–V' in the FIG. 5A embodiment.

FIG. 7 is a longitudinal sectional view of the BGA mounting structure of the prior art.

DETAILED DESCRIPTION OF THE PREFERRED EMBODIMENTS (1st Embodiment)

Figure 1B:
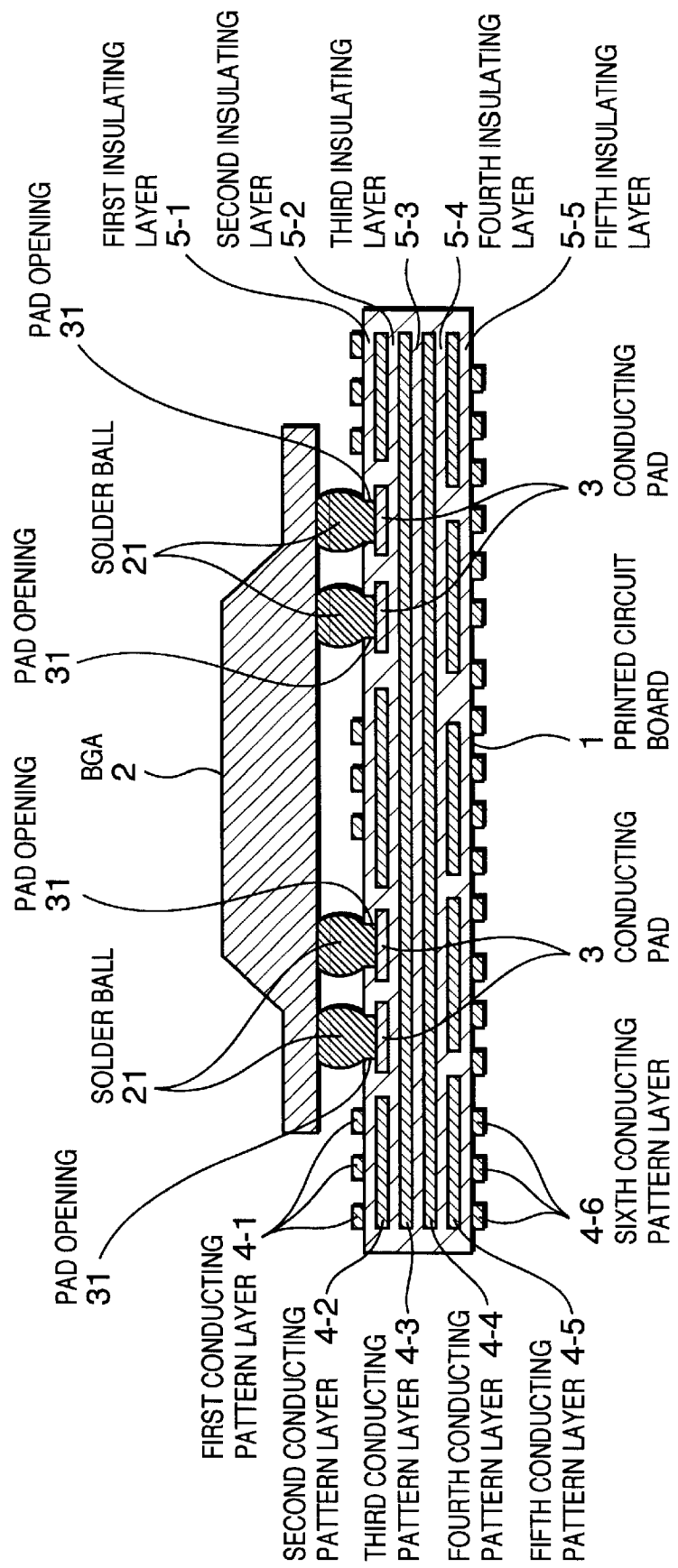
FIG. 1B is a cross sectional view showing along the line I–I' in the FIG. 1A embodiment.

FIG. 1A is a plan view of a printed circuit board according to the first embodiment of the present invention. FIG. 1B is a cross sectional view showing along the line I–I' in the FIG. 1A embodiment.

In FIGS. 1A and 1B, a BGA (ball grid array) 2 is mounted on a printed circuit board 1. These printed circuit board 1 and BGA 2 are both mechanically and electrically connected each other by pad openings 31 formed on the upper surface of the printed circuit board 1 and solder balls 21 formed on the bottom surface of the BGA 2.

In FIG. 1B, the printed circuit board 1 is a six-layered board formed by alternately stacking six conducting pattern layers 4-1 to 4-6 and five insulating layers 5-1 to 5-5. Each of the conducting pattern layers 4-1 to 4-6 is formed in a wiring pattern of a specific shape. Desired combination of these conducting pattern layers 4-1 to 4-6 is further electrically connected by throughholes (not shown).

In FIG. 1B, in a plurality of specific positions on the second conducting pattern layer 4-2, not exposed on the top surface of the printed circuit board 1, conducting pads 3 to be electrically connected to this second conducting pattern 4-2 are formed. The plurality of specific positions are directly underneath the solder balls 21 of the BGA 2.

The insulating layer 5-1 immediately next to this conducting pattern layer 4-2 toward the top surface of the printed circuit board 1 is formed pad openings 31 to accommodate the solder balls 21 therein.

No wiring pattern of the conducting pattern layer 4-1 is formed in the positions on the conducting pattern layer 4-1, which is toward the top surface of the printed circuit board 1, directly above these pads 3.

Furthermore, the peripheral parts of the pad openings 31 closer to the top surface of the printed circuit board 1 than the conducting pads 3 are formed by extending the insulating layers 5-1 and 5-2 to support the conducting pads 3 from around so they may not come off toward the pad openings 31.

These conducting pads 3 and pad openings 31 are circularly shaped, and the diameter of the former should desirably be greater by 50 to 100 μm than that of the latter, but these dimensions need not be so strictly specified.

To mount the BGA 2 onto the printed circuit board 1 in this embodiment, the BGA 2 can be soldered, together with other surface-mounted electronic parts, by a collective reflowing method onto the top surface of the printed circuit board 1 as shown in FIG. 1B.

In this process, the solder balls 21 are melted by heating and, after evenly spreading within the pad openings 31, are cooled to solidify, keeping to fill the inside of the pad openings 31.

Therefore, while the solders 21 are both mechanically bonded and electrically connected to the conducting pads 3 each other, the solder balls 21 are caught by the vertical faces of the insulating layers 5-1 and 5-2 facing the pad openings 31, resulting in substantially enhanced mechanical bonding strength.

In this embodiment, the solder balls 21 of the BGA 2 are both mechanically and electrically connected to the conducting pattern layer 4-2 each other inside the printed circuit board 1 and at the same time the insulating layer 5-2 holds them from their surroundings. Therefore a high mechanical bonding strength is achieved between the BGA 2 and the printed circuit board 1.

Next will be described the manufacturing method of a printed circuit board according to the present invention. Here is described a case in which a build-up method is applied, which is well known to those skilled in the art.

Figure 1C:
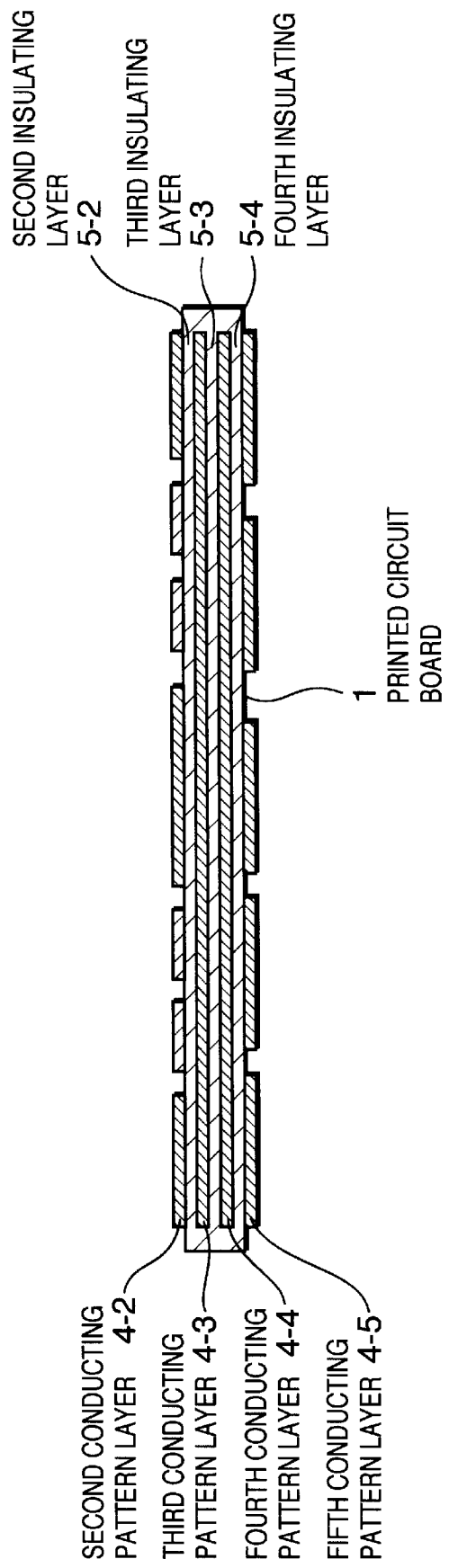
FIG. 1C is a cross sectional view of the first step of the manufacturing method showing along the line I–I' in the FIG. 1A embodiment.
Figure 1D:
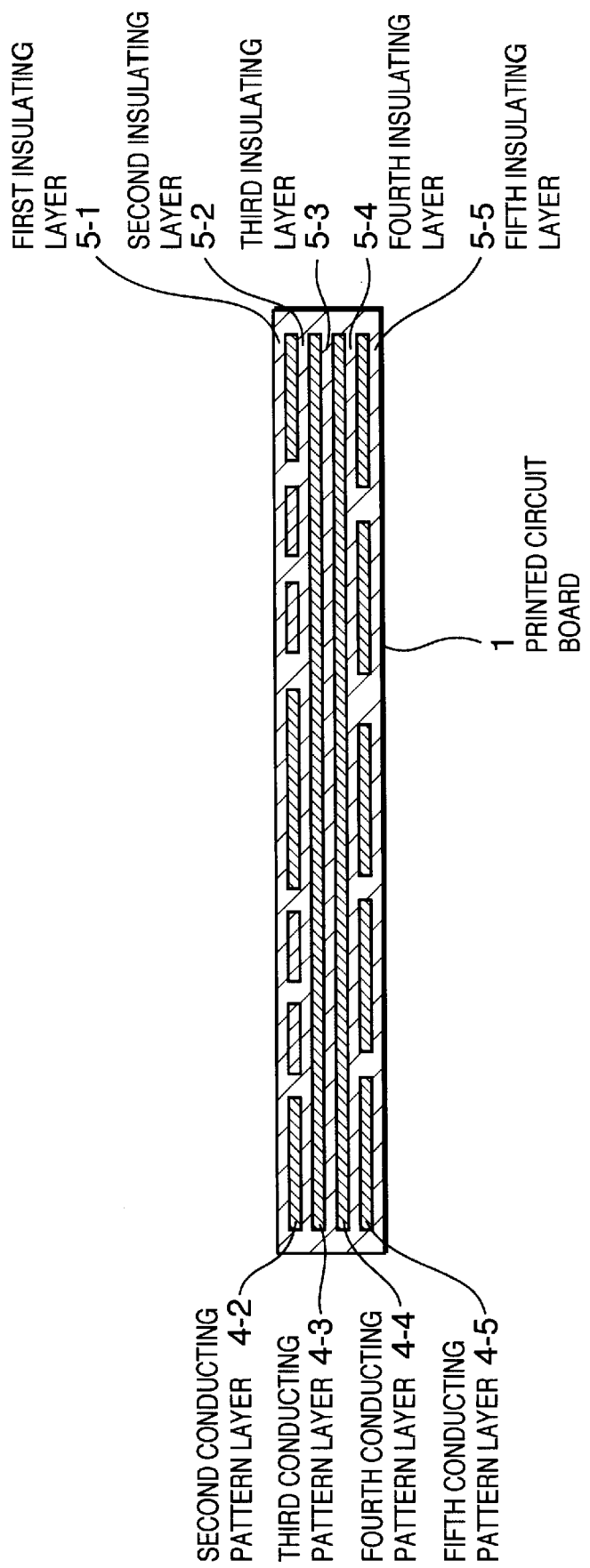
FIG. 1D is a cross sectional view of the second step of the manufacturing method showing along the line I–I' in the FIG. 1A embodiment.

FIG. 1C is a cross sectional view of the first step of the manufacturing method showing along the line I–I' in the FIG. 1A embodiment. FIG. 1D is a cross sectional view of the second step of the manufacturing method showing along the line I–I' in the FIG. 1A embodiment. FIG. 1E is a cross sectional view of the third step of the manufacturing method showing along the line I–I' in the FIG. 1A embodiment. FIG. 1F is a cross sectional view of the fourth step of the manufacturing method showing along the line I–I' in the FIG. 1A embodiment.

In advance, the conducting pattern layers 4-2 to 4-5 and the insulating layers 5-2 to 5-4 are alternately stacked by a known subtractive method or the like to form the conducting pattern layers 4-2 to 4-5 as wiring patterns having respectively required shapes as shown in FIG. 1C.

Next, epoxy-based liquid insulating resin is applied onto the surfaces of the conducting pattern layers 4-2 and 4-5 and of the insulating layers 5-2 and 5-4 and hardened, the insulating layers 5-1 and 5-5 are formed as shown in FIG. 1D.

Then, the pad openings 31 are formed as shown in FIG. 1E by a known laser method, photoetching or the like in the parts of the wiring pattern of the conducting pattern layer 4-2, to constitute connecting points to the solder balls 21 of the BGA 2 so that these parts are exposed on the top surface of the printed circuit board 1 toward the insulating layer 5-1 side.

Next, throughholes for mutual electrical connection of the conducting pattern layers 4-2 to 4-5 are formed by penetrating through all the insulating layers 5-1 to 5-5.

Then the pad openings 31 and other parts are masked as required.

Next, by a known additive process, the conducting pattern layer 4-1 is formed over the surface of the insulating layer 5-1, and the conducting pattern layer 4-6 is formed over the surface of the insulating layer 5-5 as wiring patterns having respectively required shapes.

Finally, the masking is removed to complete the mounting.

(2nd Embodiment)

Figure 2A:
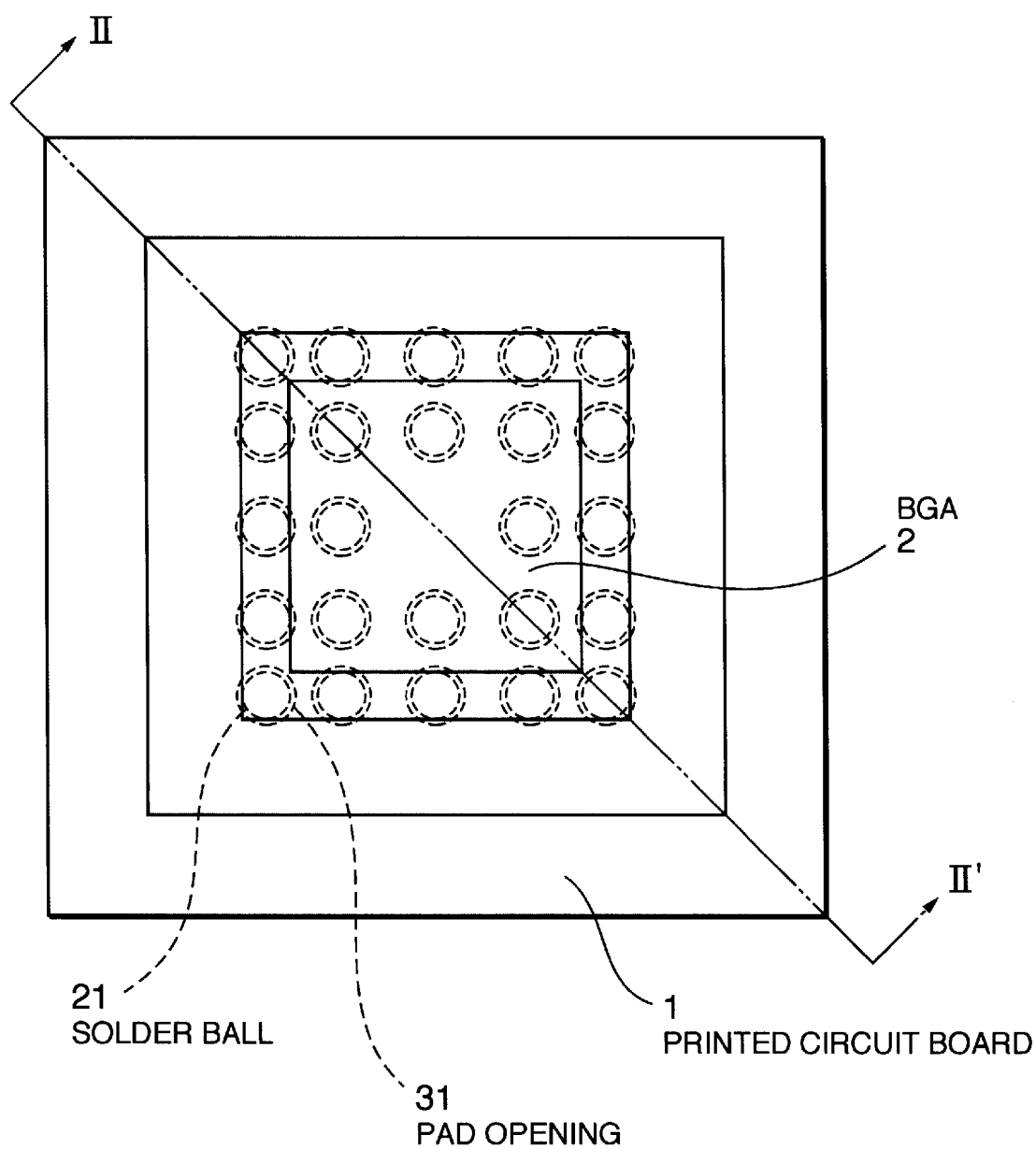
FIG. 2A is a plan view of a printed circuit board according to the second embodiment of the present invention.
Figure 2B:
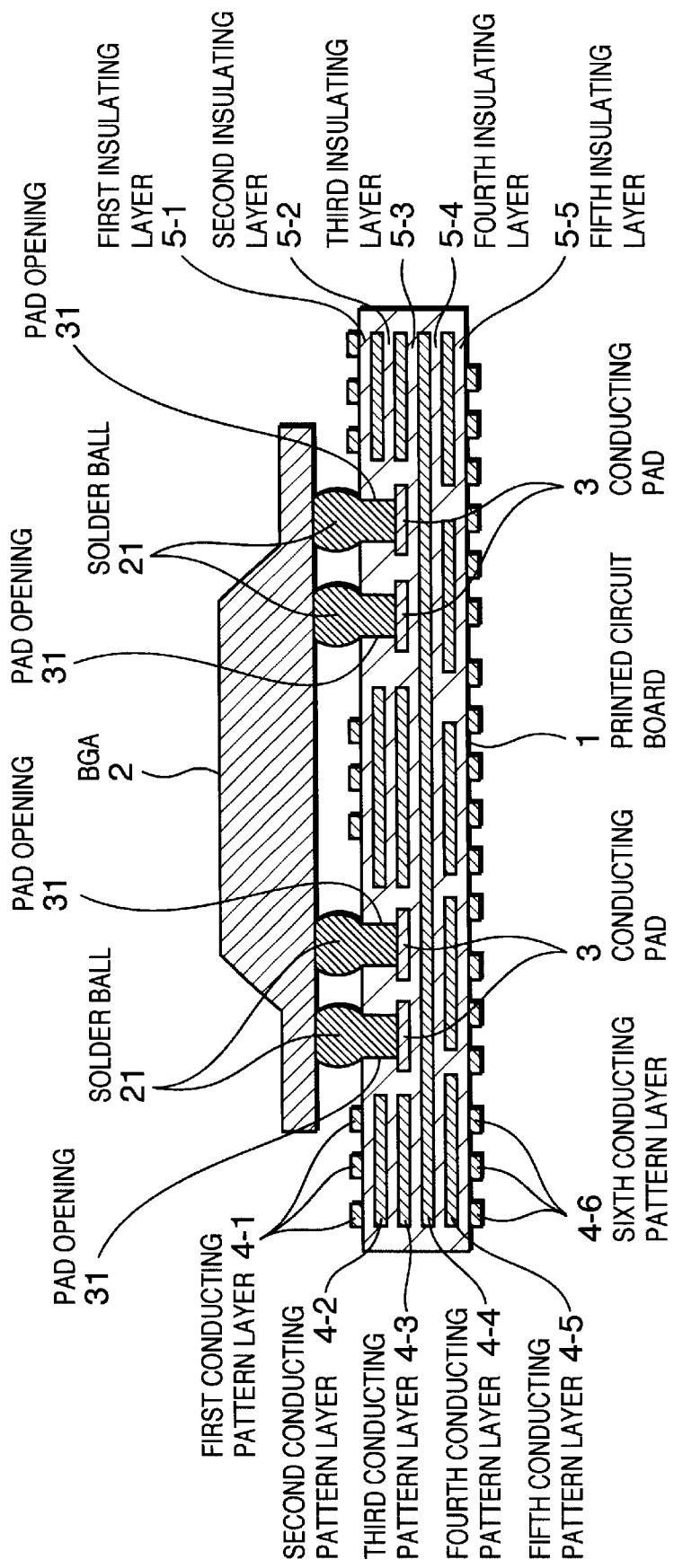
FIG. 2B is a cross sectional view showing along the line II–II' in the FIG. 2A embodiment.

FIG. 2A is a plan view of a printed circuit board according to the second embodiment of the present invention. FIG. 2B is a cross sectional view showing along the line II–II' in the FIG. 2A embodiment.

In FIGS. 2A and 2B, the same elements as shown in FIGS. 1A and 1B have the same reference numbers, and their description is omitted.

In FIGS. 2A and 2B, conducting pads 3 are provided in specific positions on the third conducting pattern layer 4-3.

The pad openings 31 are formed for accommodating the solder balls 21 within in the positions on the insulating layers 5-1, 5-2 and the conducting pattern layer 4-2, which are closer to the top surface of a printed circuit board 1 than the conducting pattern layer 4-3.

No wiring pattern of the conducting pattern layers 4-1 and 4-2 is formed in the positions on the conducting pattern layers 4-1 and 4-2, which are closer to the top surface of the printed circuit board 1 than the conducting pads 3, directly above these pads 3.

Furthermore, the peripheral parts of the pad openings 31 closer to the top surface of the printed circuit board 1 than the conducting pads 3 are formed by extending the insulating layers 5-1 and 5-3 to support the conducting pads 3 from around so they may not come off toward the pad openings 31.

In this embodiment, the size of supporting the solder balls 21 from around is greater than in the first embodiment. Therefore not only can mechanical bonding strength be further enhanced, but also can the solder balls 21 of the BGA 2 be electrically connected to the conducting pattern layer 4-3 within the printed circuit board 1.

(3rd Embodiment)

Figure 3A:
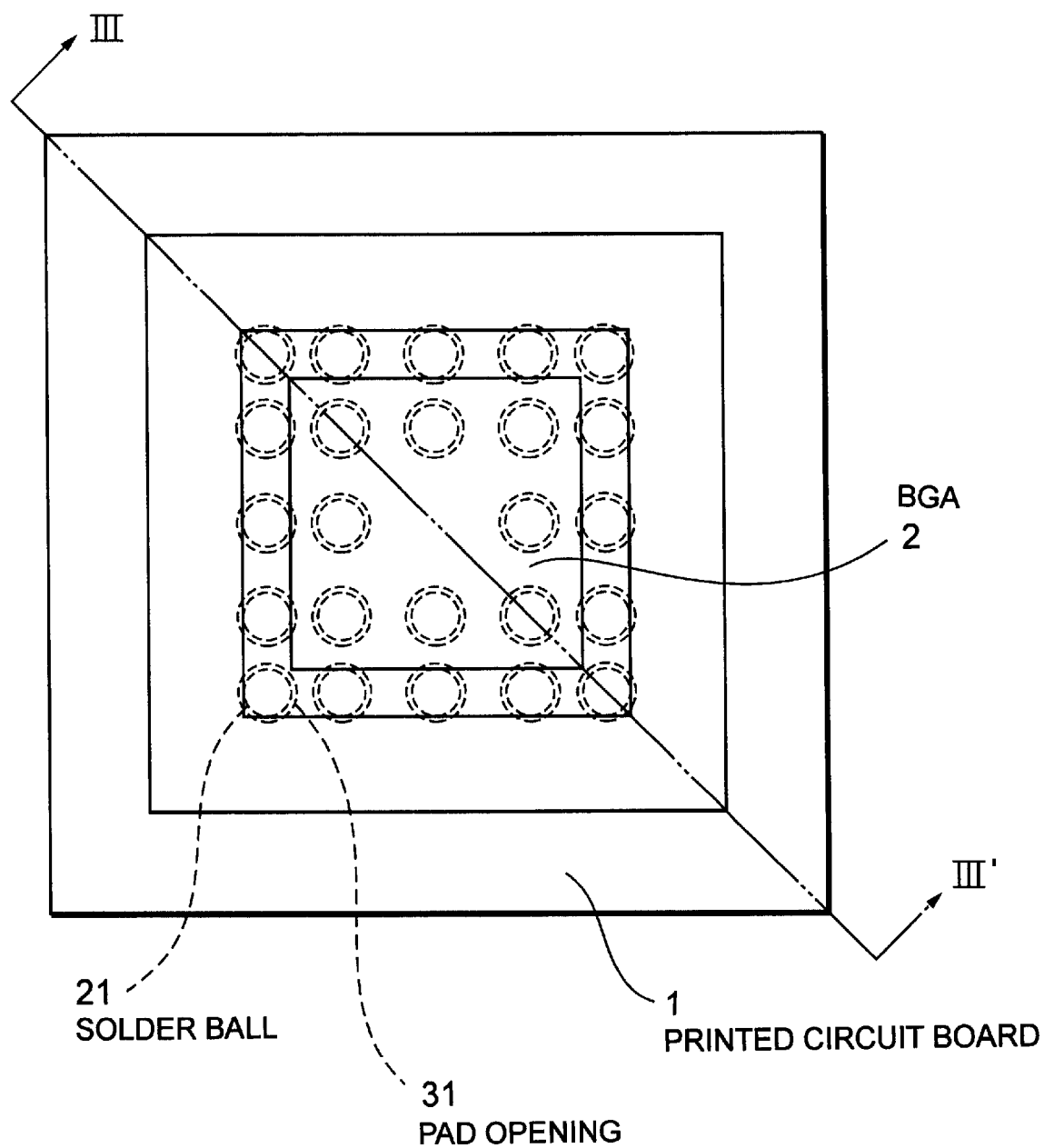
FIG. 3A is a plan view of a printed circuit board according to the third embodiment of the present invention.
Figure 3B:
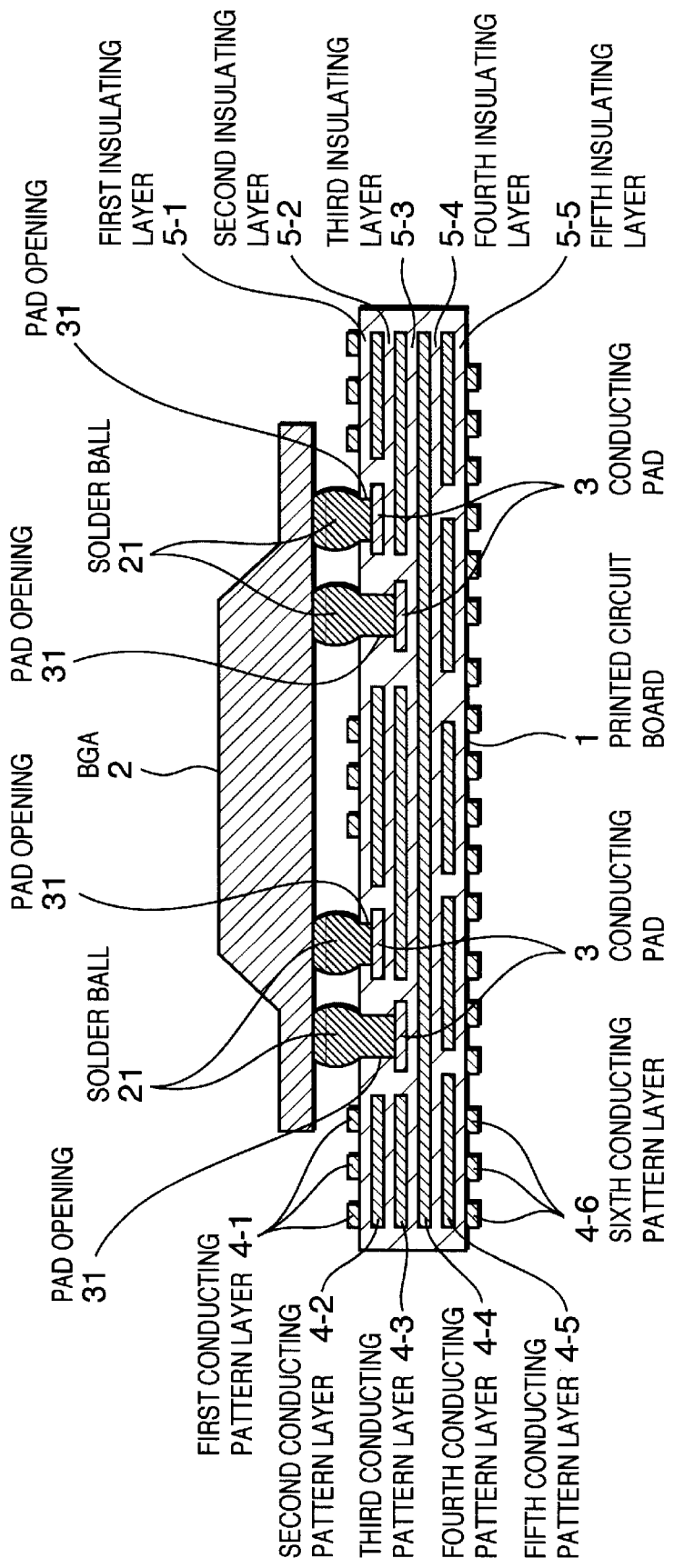
FIG. 3B is a cross sectional view showing along the line III–III' in the FIG. 3A embodiment.

FIG. 3A is a plan view of a printed circuit board according to the third embodiment of the present invention. FIG. 3B is a cross sectional view showing along the line III–III' in the FIG. 3A embodiment.

In FIGS. 3A and 3B, the same elements as in FIGS. 1A to 2B have the same reference numbers, and their description is omitted.

In FIGS. 3A and 3B, conducting pads 3 are provided in specific positions on the second and third conducting pattern layers 4-2 and 4-3.

The pad openings 31 are formed for accommodating the solder balls 21 within in the positions on the insulating layer 5-1 and the conducting pattern layer 4-1, which are closer to the top surface of a printed circuit board 1 than the conducting pattern layer 4-2.

No wiring pattern of the conducting pattern layer 4-1 is formed in the positions on the conducting pattern layer 4-1, which are closer to the top surface of the printed circuit board 1 than the conducting pads 3 of the conducting pattern layer 4-2, directly above these pads 3.

Furthermore, the peripheral parts of the pad openings 31 closer to the top surface of the printed circuit board 1 than the conducting pads 3 of the conducting pattern layer 4-2 are formed by extending the insulating layers 5-1 and 5-2 to support the conducting pads 3 from around so they may not come off toward the pad openings 31.

Similarly, the pad openings 31 are formed for accommodating the solder balls 21 within in the positions on the insulating layers 5-1 and 5-2 and the conducting pattern layers 4-1 and 4-2, which are closer to the top surface of a printed circuit board 1 than the conducting pattern layer 4-3.

No wiring pattern of the conducting pattern layers 4-1 and 4-2 is formed in the positions on the conducting pattern layers 4-1 and 4-2, which are closer to the top surface of the printed circuit board 1 than the conducting pads 3 of the conducting pattern layer 4-3, directly above these pads 3.

Furthermore, the peripheral parts of the pad openings 31 closer to the top surface of the printed circuit board 1 than the conducting pads 3 of the conducting pattern layer 4-3 are formed by extending the insulating layers 5-1 to 5-3 to support the conducting pads 3 from around so they may not come off toward the pad openings 31.

Since this embodiment is configured in this manner, not only is enhanced mechanical bonding strength as in the second embodiment, but also can the solder balls 21 of the BGA 2 be electrically connected to any of the plurality of conducting pattern layers 4-2 to 4-5.

(4th Embodiment)

Figure 4A:
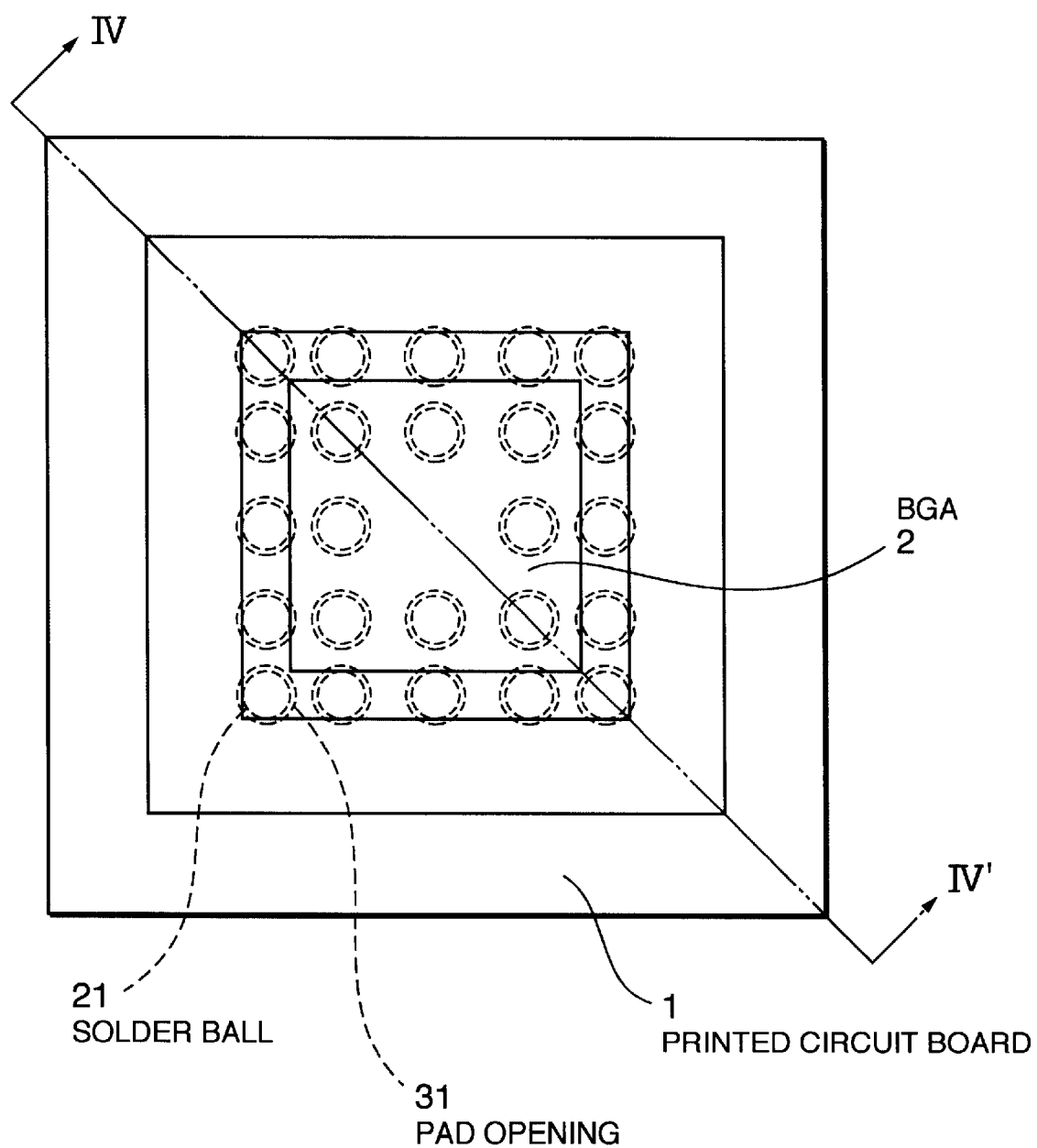
FIG. 4A is a plan view of a printed circuit board according to the fourth embodiment of the present invention.
Figure 4B:
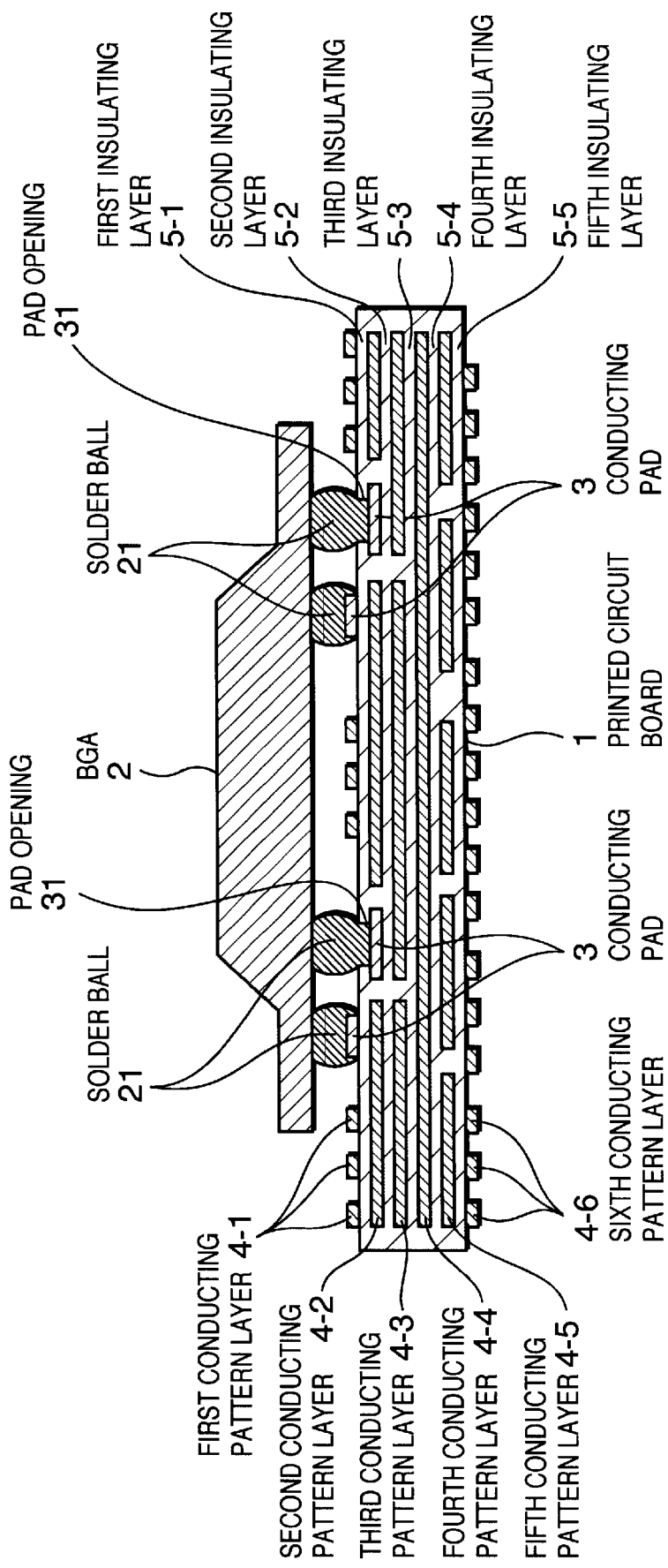
FIG. 4B is a cross sectional view showing along the line IV–IV' in the FIG. 4A embodiment.

FIG. 4A is a plan view of a printed circuit board according to the fourth embodiment of the present invention. FIG. 4B is a cross sectional view showing along the line IV–IV' in the FIG. 4A embodiment.

In FIGS. 4A and 4B, the same elements as in FIGS. 1A to 3B have the same reference numbers, and their description is omitted.

In FIGS. 4A and 4B, conducting pads 3 are provided in specific positions on the first and second conducting pattern layers 4-1 and 4-2.

The pad openings 31 are formed for accommodating the solder balls 21 within in the positions on the insulating layer 5-1 and the conducting pattern layer 4-1, which are closer to the top surface of a printed circuit board 1 than the conducting pattern layer 4-2.

No wiring pattern of the conducting pattern layer 4-1 is formed directly above these conducting pads 3.

Furthermore, the peripheral parts of the pad openings 31 closer to the top surface of the printed circuit board 1 than the conducting pads 3 of the conducting pattern layer 4-2 are formed by extending the insulating layers 5-1 and 5-2 to support the conducting pads 3 from around so they may not come off toward the pad openings 31.

Since this embodiment is configured in this manner, not only is enhanced mechanical bonding strength as in the first embodiment, but also can the solder balls 21 of the BGA 2 be electrically connected to the conducting pattern layer 4-1 on the top surface of the printed circuit board 1.

(5th Embodiment)

Figure 5A:
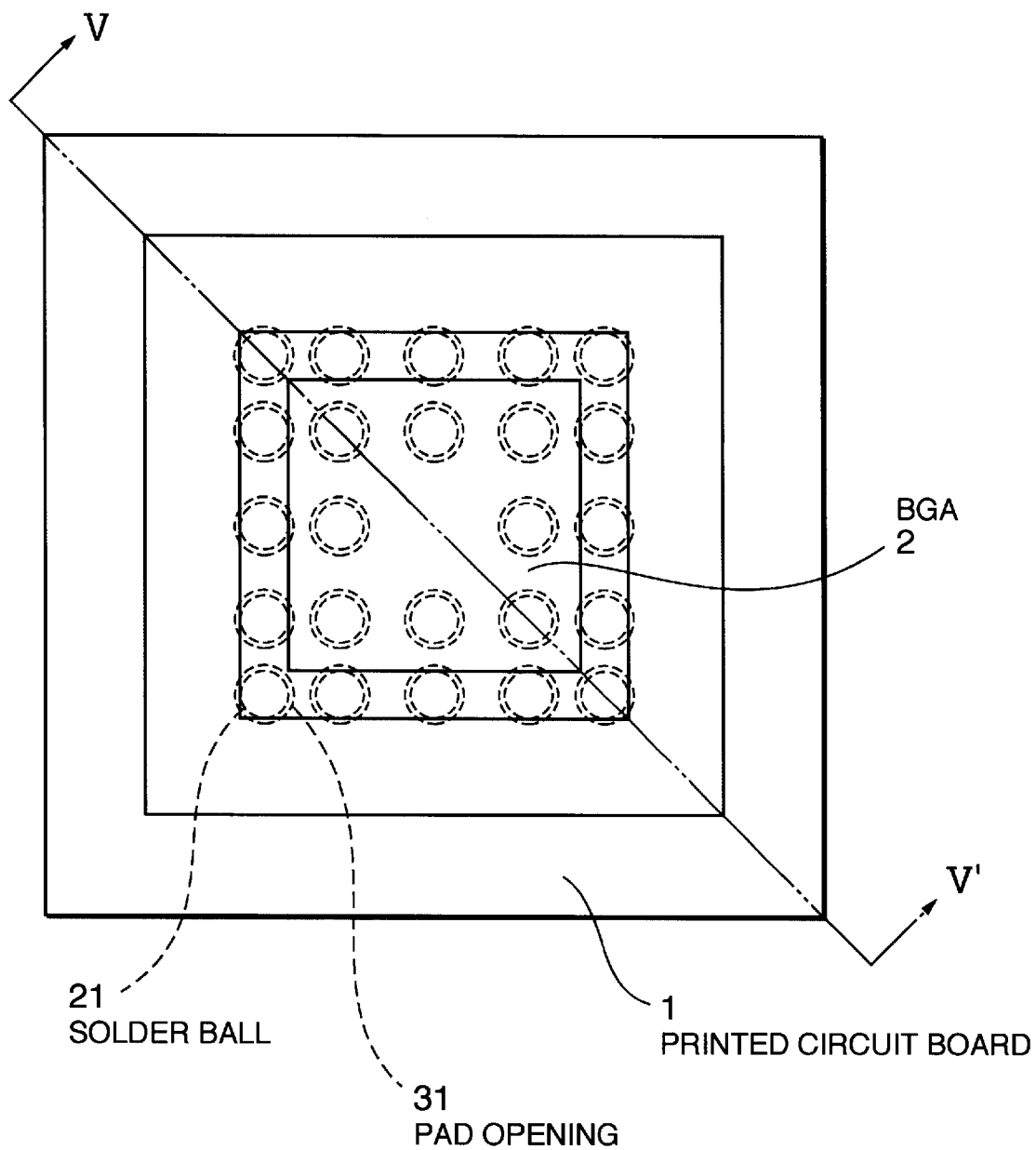
FIG. 5A is a plan view of a printed circuit board according to the fifth embodiment of the present invention.

FIG. 5A is a plan view of a printed circuit board according to the fifth embodiment of the present invention. FIG. 5B is a cross sectional view showing along the line V–V' in the FIG. 5A embodiment.

In FIGS. 5A and 5B, the same elements as shown in FIGS. 1A to 4B have the same reference numbers, and their description is omitted.

In FIGS. 5A and 5B, there are only two conducting pattern layers and insulating layers each, respectively 4-1, 4-2 and 5-1, 5-2, and conducting pads 3 are provided in specific positions on the second conducting pattern layer 4-2.

The pad openings 31 are formed for accommodating the solder balls 21 within in the positions on the insulating layer 5-1 and the conducting pattern layer 4-1, which are closer to the top surface of a printed circuit board 1 than the conducting pattern layer 4-2.

No wiring pattern of the conducting pattern layer 4-1 is formed directly above these conducting pads 3.

Furthermore, the peripheral parts of the pad openings 31 closer to the top surface of the printed circuit board 1 than the conducting pads 3 of the conducting pattern layer 4-2 are formed by extending the insulating layers 5-1 and 5-2 to support the conducting pads 3 from around so they may not come off toward the pad openings 31.

Since this embodiment is configured in this manner, mechanical bonding strength is enhanced as in the first embodiment.

(6th Embodiment)

Figure 6A:
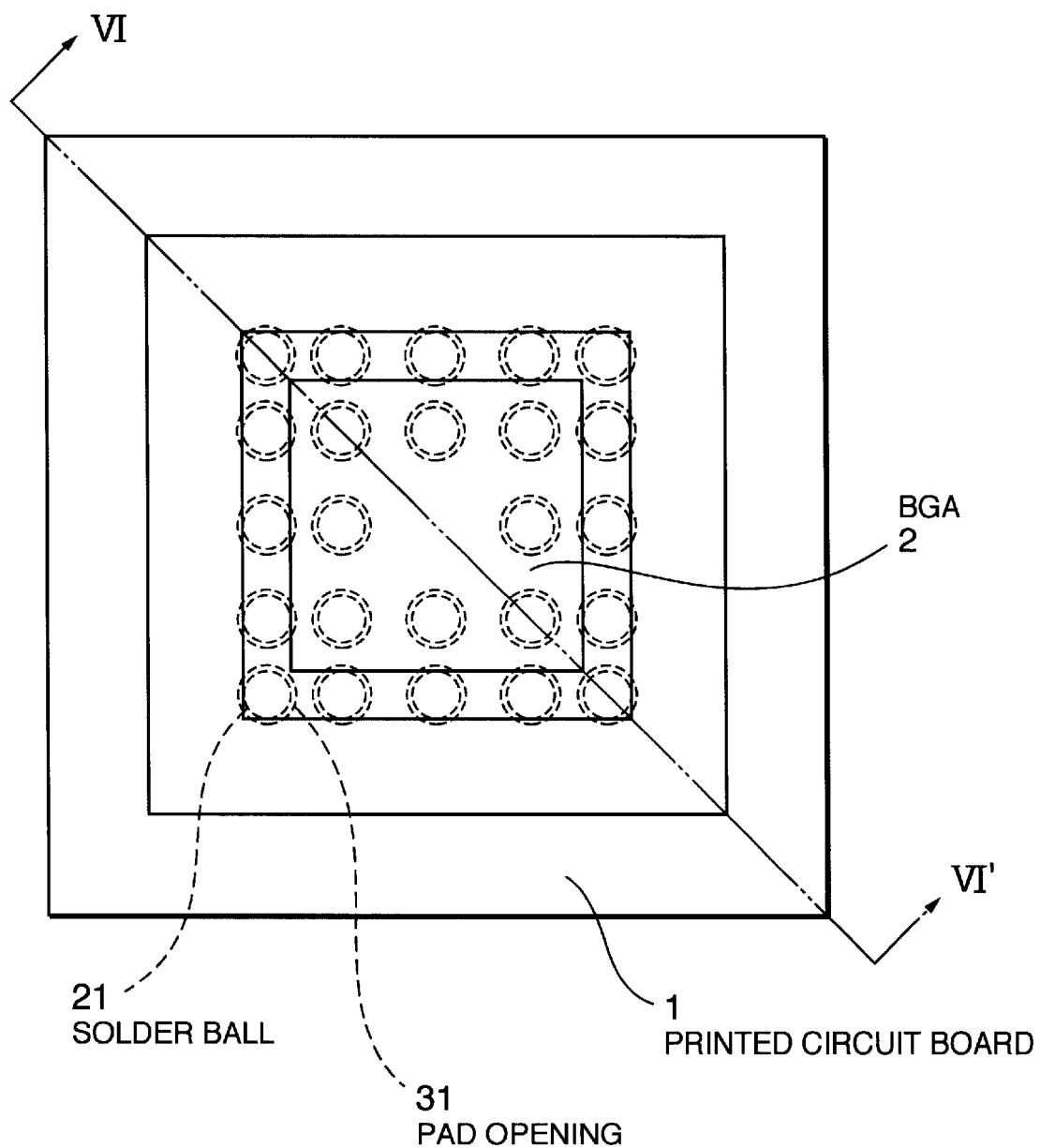
FIG. 6A is a plan view of a printed circuit board according to the sixth embodiment of the present invention.
Figure 6B:
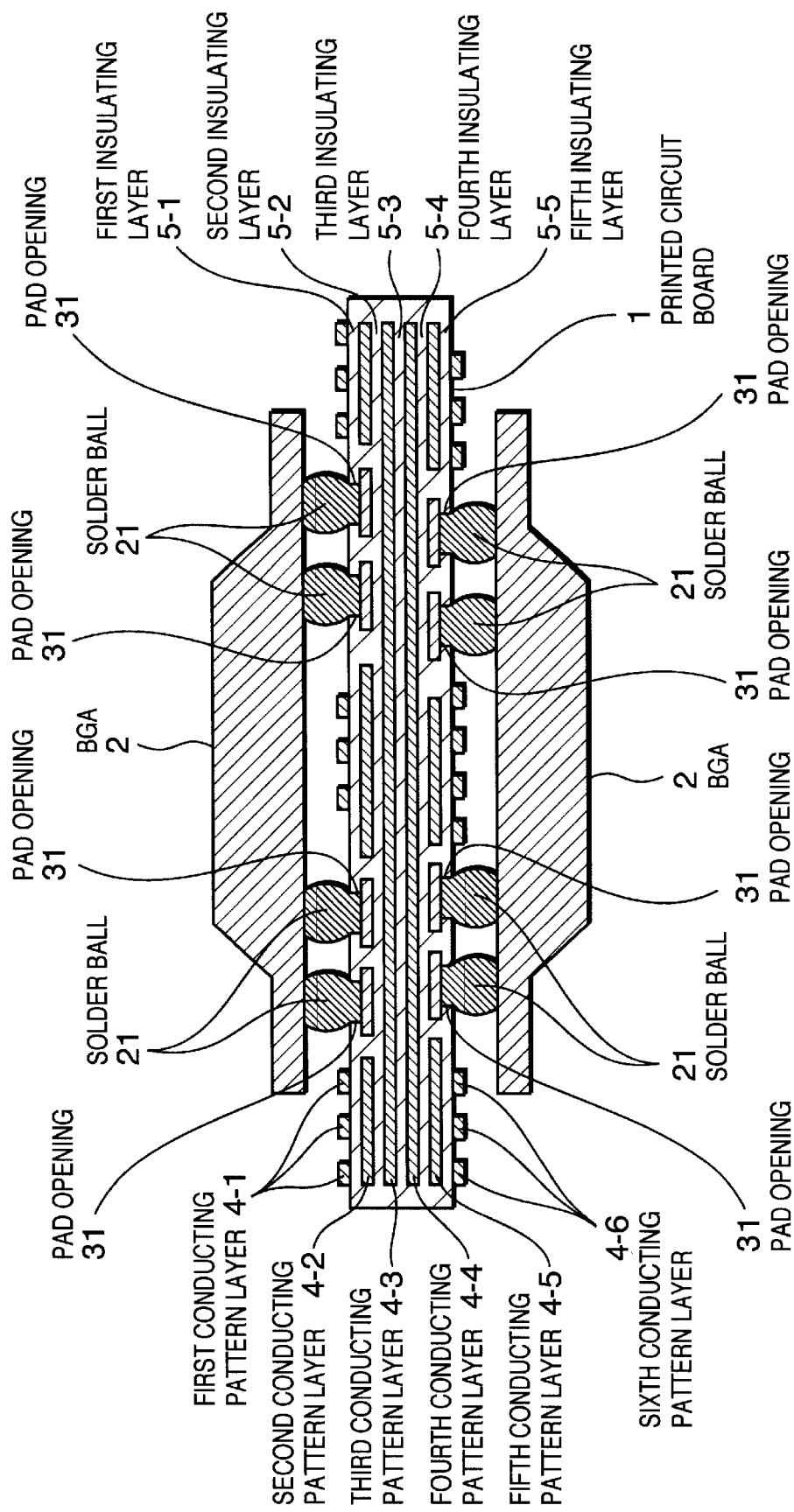
FIG. 6B is a cross sectional view showing along the line VI–VI' in the FIG. 6A embodiment.

FIG. 6A is a plan view of a printed circuit board according to the sixth embodiment of the present invention. FIG. 6B is a cross sectional view showing along the line VI–VI' in the FIG. 6A embodiment.

In FIGS. 6A and 6B, the same elements as shown in FIGS. 1A to 5B have the same reference numbers, and their description is omitted.

In FIGS. 6A and 6B, two BGAs 2 are mounted on both surfaces of the printed circuit board 1.

The conducting pads 3 are provided in specific positions on the second and fifth conducting pattern layers 4-2 and 4-5.

The pad openings 31 are formed for accommodating the solder balls 21 within in the positions on the insulating layer 5-1 and the conducting pattern layer 4-1, which are closer to the top surface of a printed circuit board 1 than the conducting pattern layer 4-2.

No wiring pattern of the conducting pattern layer 4-1 is formed directly above these conducting pads 3.

Furthermore, the peripheral parts of the pad openings 31 closer to the top surface of the printed circuit board 1 than the conducting pads 3 of the conducting pattern layer 4-2 are formed by extending the insulating layers 5-1 and 5-2 to support the conducting pads 3 from around so they may not come off toward the pad openings 31.

Similarly, the pad openings 31 are formed for accommodating the solder balls 21 within in the positions on the insulating layer 5-5 and the conducting pattern layer 4-6, which are closer to the top surface of a printed circuit board 1 than the conducting pattern layer 4-5.

No wiring pattern of the conducting pattern layer 4-6 is formed directly above these conducting pads 3.

Furthermore, the peripheral parts of the pad openings 31 closer to the bottom surface of the printed circuit board 1 than the conducting pads 3 of the conducting pattern layer 4-5 are formed by extending the insulating layers 5-4 and 5-5 to support the conducting pads 3 from around so they may not come off toward the pad openings 31.

Since this embodiment is configured in this manner, not only can BGAs be mounted on both sides of the printed circuit board, but also is enhanced mechanical bonding strength as in the first embodiment.

Although a BGA 2 were cited as an example of an electronic part to be mounted on the printed circuit board 1 in every embodiment described, the electronic part(s) to be mounted may be any other appropriate semiconductor element(s), another printed circuit board or the like.

In every embodiment described above, the solder balls 21 of the BGA 2 were cited as an example of members to be soldered to the conducting pads 3, but the members to be soldered may as well be solder bumps or the like.

Though what constitute a conducting pattern layer are cited as an example of conducting pads to be electrically connected to soldered electronic parts in every one of the foregoing embodiments, these conducting pads may as well form a metallic layer on the surface of a conducting pattern layer.

In every embodiment described, it is sufficient for the sizes of the pad openings in the conducting pattern layer located closer to the top surface than the conducting pads to be greater than the sizes of the conducting pads. In other words, it is sufficient for the conducting pattern layer to be exposed in the pad openings.

In every one of the foregoing embodiments, it is sufficient for the sizes of the pad openings in the insulating layer located closer to the top surface than the conducting pads to be smaller than the sizes of the conducting pads. In other words, it is sufficient for the insulating layer to be exposed in the pad openings.

Although insulating layers are extended to cover the inside of the openings in every embodiment described above, the inside may as well be covered with another insulator, which may be of either the same material as that of said insulating layers or something else.

As hitherto described, according to the present invention, internal conducting pattern layers not exposed to the surface and soldered members of electronic parts are both mechanically bonded and electrically connected each other in a printed circuit board in which the conducting pattern layers and insulating layers are stacked alternately.

Furthermore, these connecting parts are formed as openings in the surface of the printed circuit board, and the strength of connection between conducting pads and the conducting pattern layers is substantially increased by providing insulating layers on the inner walls of these openings to prevent the conducting pads from coming off.

Therefore, a printed circuit board can be realized of which mechanical bonding strength is remarkably high, electrical connection is reliable, and mounting can be readily accomplished.

In this manner, poor contact between solder balls and conducting pads and damages, such as peeling of conductor pads, due to bending, vibration, impact and the like working on the printed circuit board can be significantly reduced.

What is claimed is:

1. A printed circuit board comprising:

a first surface for mounting a ball grid array element;

n (n: an integer) conducting pattern layers on each of which a wiring pattern is formed;

(n+1) insulating layers formed alternately with said conducting pattern layers;

conducting pads formed on said wiring patterns of said conducting pattern layers;

openings continuing from said conducting pads to said first surface for mounting the ball grid array element, said first surface corresponding to a topmost of said insulating layers, said openings penetrating any intermediate insulating layers, said openings when a ball grid array element is mounted providing sideways support of solder connecting the ball grid array element to said conducting pads;

a second surface opposite said first surface for mounting another ball grid array element;

other conducting pads formed on said wiring patterns of said conducting pattern layers; and other openings continuing from said other conducting pads to said second surface of an insulating layer opposite said topmost insulating layer, said other openings penetrating any intermediate insulating layers, said other openings when another ball grid array element is mounted providing sideways support of solder connecting the ball grid array element to said other conducting pads.

2. The printed circuit board, as defined in claim 1, wherein a conducting pattern layer is further stacked over said insulating layer opposite said topmost insulating layer.

3. A printed circuit board comprising:

a first surface for mounting a ball grid array element;

n (n: an integer) conducting pattern layers on each of which a wiring pattern is formed;

(n+1) insulating layers formed alternately with said conducting pattern layers;

conducting pads formed on said wiring patterns of said conducting pattern layers;

openings continuing from said conducting pads to said first surface for mounting the ball grid array element, said first surface corresponding to a topmost of said insulating layers, said openings penetrating any intermediate insulating layers, said openings when a ball grid array element is mounted providing sideways support of solder connecting the ball grid array element to said conducting pads;

wherein a conducting pattern layer having a wiring pattern with said openings is further stacked over said topmost insulating layer.

4. A printed circuit board comprising:

a first surface for mounting a ball grid array element;

n (n: an integer) conducting pattern layers on each of which a wiring pattern is formed:

(n+1) insulating layers formed alternately with said conducting pattern layers;

conducting pads formed on said wiring patterns of said conducting pattern layers;

openings continuing from said conducting pads to said first surface for mounting the ball grid array element, said first surface corresponding to a topmost of said insulating layers, said openings penetrating any intermediate insulating layers, said openings when a ball grid array element is mounted providing sideways support of solder connecting the ball grid array element to said conducting pads;

wherein said conducting pads consist of said conducting pattern layer.

5. A printed circuit board comprising:

a first surface for mounting a ball grid array element;

n (n: an integer) conducting pattern layers on each of which a wiring pattern is formed;

(n+1) insulating layers formed alternately with said conducting pattern layers;

conducting pads formed on said wiring patterns of said conducting pattern layers;

openings continuing from said conducting pads to said first surface for mounting the ball grid array element, said first surface corresponding to a topmost of said insulating layers, said openings penetrating any intermediate insulating layers, said openings when a ball grid array element is mounted providing sideways support of solder connecting the ball grid array element to said conducting pads;

wherein the size of said openings of said conducting pattern layers is greater than the size of said conducting pads.

6. A printed circuit board comprising:

a first surface for mounting a ball grid array element;

n (n: an integer) conducting pattern layers on each of which a wiring pattern is formed;

(n+1) insulating layers formed alternately with said conducting pattern layers;

conducting pads formed on said wiring patterns of said conducting pattern layers;

openings continuing from said conducting pads to said first surface for mounting the ball grid array element, said first surface corresponding to a topmost of said insulating layers, said openings penetrating any intermediate insulating layers, said openings when a ball grid array element is mounted providing sideways support of solder connecting the ball grid array element to said conducting pads;

wherein a vertical face inside of said openings is covered by an insulator.

7. The printed circuit board, as defined in claim 6, wherein said insulator is of the same material as said insulating layers.

8. A manufacturing method of a printed circuit board comprising:

forming by alternatively stacking (n+1) (n: an integer) insulating layers with n conducting pattern layers on each of which a wiring pattern is formed, the stacked layers having a first surface corresponding to a topmost of said insulating layers for mounting a ball grid array element, wherein the stacked layers have a second surface opposite said first surface for mounting another ball grid array element;

forming openings continuing from said first surface corresponding to the topmost of said insulating layers to conducting pads formed on said wiring patterns of said conducting pattern layers, said openings penetrating any intermediate insulating layers, said openings when a ball grid array element is mounted providing sideways support of solder connecting the ball grid array element to said conducting pads;

forming other conducting pads on said wiring patterns of said conducting pattern layers; and forming other openings continuing from said other conducting pads to said second surface of an insulating layer opposite said topmost insulating layer, said other openings when another ball grid array element is mounted providing sideways support of solder connecting the ball grid array element to said other conducting pads.

9. The manufacturing method of a printed circuit board, as defined in claim 8, wherein a conducting pattern layer is further stacked over said insulating layer opposite said topmost insulating layer.

10. A manufacturing method of a printed circuit board comprising:

forming by alternatively stacking (n+1) (n: an integer) insulating layers with n conducting pattern layers on each of which a wiring pattern is formed, the stacked layers having a first surface corresponding to a topmost of said insulating layers for mounting a ball grid array element;

forming openings continuing from said first surface corresponding to the topmost of said insulating layers to conducting pads formed on said wiring patterns of said conducting pattern layers, said openings penetrating any intermediate insulating layers, said opening when a ball grid array element is mounted providing sideways support of solder connecting the ball grid array element to said conducting pads;

wherein a conducting pattern layer having a wiring pattern with said openings is further stacked over said topmost insulating layer.

11. A manufacturing method of a printed circuit board comprising:

forming by alternatively stacking (n+1) (n: an integer) insulating layers with n conducting pattern layers on each of which a wiring pattern is formed, the stacked layers having a first surface corresponding to a topmost of said insulating layers for mounting a ball grid array element;

forming openings continuing from said first surface corresponding to the topmost of said insulating layers to conducting pads formed on said wiring patterns of said conducting pattern layers, said openings penetrating any intermediate insulating layers, said openings when a ball grid array element is mounted providing sideways support of solder connecting the ball grid array element to said conducting pads;

wherein said conducting pads consist of said conducting pattern layer.

12. A manufacturing method of a printed circuit board comprising:

forming by alternatively stacking (n+1) (n: an integer) insulating layers with n conducting pattern layers on each of which a wiring pattern is formed, the stacked layers having a first surface corresponding to a topmost of said insulating layers for mounting a ball grid array element;

forming openings continuing from said first surface corresponding to the topmost of said insulating layers to conducting pads formed on said wiring patterns of said conducting pattern layers, said openings penetrating any intermediate insulating layers, said openings when a ball grid array element is mounted providing sideways support of solder connecting the ball grid array element to said conducting pads;

wherein the size of said openings of said conducting pattern layers is greater than the size of said conducting pads.

13. A manufacturing method of a printed circuit board comprising:

forming by alternatively stacking (n+1) (n: an integer) insulating layers with n conducting pattern layers on each of which a wiring pattern is formed, the stacked layers having a first surface corresponding to a topmost of said insulating layers for mounting a ball grid array element;

forming openings continuing from said first surface corresponding to the topmost of said insulating layers to conducting pads formed on said wiring patterns of said conducting pattern layers, said openings penetrating any intermediate insulating layers, said openings when a ball grid array element is mounted providing sideways support of solder connecting the ball grid array element to said conducting pads;

wherein a vertical face inside of said openings is covered by an insulator.

14. The manufacturing method of a printed circuit board, as defined in claim 13, wherein said insulator is of the same material as said insulating layers.

\* \* \* \* \*